(12) United States Patent
Shinohara et al.

(10) Patent No.: US 11,728,358 B2
(45) Date of Patent: Aug. 15, 2023

(54) PHOTOELECTRIC CONVERSION APPARATUS, IMAGE SENSOR, SEMICONDUCTOR APPARATUS, PHOTOELECTRIC CONVERSION SYSTEM, AND EQUIPMENT

(71) Applicant: CANON KABUSHIKI KAISHA, Tokyo (JP)

(72) Inventors: Mahito Shinohara, Tokyo (JP); Hiroshi Sekine, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 17/476,591

(22) Filed: Sep. 16, 2021

(65) Prior Publication Data

US 2022/0093662 A1 Mar. 24, 2022

(30) Foreign Application Priority Data

Sep. 23, 2020 (JP) ................................ 2020-158968

(51) Int. Cl.
*H01L 27/146* (2006.01)
*H04N 25/75* (2023.01)
*H04N 25/76* (2023.01)

(52) U.S. Cl.
CPC .... *H01L 27/14616* (2013.01); *H01L 27/1463* (2013.01); *H04N 25/75* (2023.01); *H04N 25/76* (2023.01)

(58) Field of Classification Search
CPC ........... H01L 27/14616; H01L 27/1463; H01L 27/14603; H01L 27/1464; H01L 27/1461;
(Continued)

(56) References Cited

U.S. PATENT DOCUMENTS 4,962,412 A 10/1990 Shinohara et al.
5,008,206 A 4/1991 Shinohara et al.
(Continued)

FOREIGN PATENT DOCUMENTS

JP 2011-142343 A 7/2011
JP 2011-249406 A 12/2011
(Continued)

OTHER PUBLICATIONS

U.S. Appl. No. 17/383,628, filed Jul. 23, 2021 (First Named Inventor: Mahito Shinohara).

*Primary Examiner* — Abdelaaziz Tissire
(74) *Attorney, Agent, or Firm* — Venable LLP

(57) ABSTRACT

A photoelectric conversion apparatus comprises a semiconductor layer including a first surface and a second surface, a first semiconductor region of a first conductivity type arranged in the semiconductor layer and configured to accumulate a signal charge generated by incident light, a second semiconductor region of the first conductivity type arranged in the semiconductor layer, a first transfer electrode configured to transfer the signal charge accumulated in the first semiconductor region to the second semiconductor region, a third semiconductor region of a second conductivity type arranged between the second semiconductor region and the second surface, and a fourth semiconductor region of the second conductivity type arranged between the third semiconductor region and the second surface. The third semiconductor region at least partially overlaps, in orthographic projection to the first surface, the second semiconductor region and the fourth semiconductor region.

12 Claims, 9 Drawing Sheets

(58) Field of Classification Search
CPC .. H01L 27/14656; H04N 25/75; H04N 25/76; H04N 5/378; H04N 5/374
See application file for complete search history.

(56) References Cited

U.S. PATENT DOCUMENTS

| | | | |
|---|---|---|---|
| 5,086,326 | A | 2/1992 | Shinohara et al. |
| 6,828,601 | B2 | 12/2004 | Shinohara |
| 7,250,970 | B2 | 7/2007 | Shinohara |
| 8,164,668 | B2 | 4/2012 | Iida et al. |
| 8,345,137 | B2 | 1/2013 | Shinohara et al. |
| 8,896,734 | B2 | 11/2014 | Shinohara |
| 8,970,769 | B2 | 3/2015 | Shinohara et al. |
| 9,437,647 | B2 | 9/2016 | Shinohara |
| 10,186,532 | B2 | 1/2019 | Kobayashi et al. |
| 10,483,307 | B2 | 11/2019 | Sekine et al. |
| 10,535,688 | B2 | 1/2020 | Onuki et al. |
| 10,714,515 | B2 | 7/2020 | Shinohara |
| 10,771,720 | B2 | 9/2020 | Shinohara |
| 10,805,563 | B2 | 10/2020 | Ikeda et al. |
| 10,818,724 | B2 | 10/2020 | Shinohara |
| 10,848,695 | B2 | 11/2020 | Miki et al. |
| 2011/0108897 | A1* | 5/2011 | Koo .................... H01L 27/1463 257/292 |
| 2015/0054997 | A1* | 2/2015 | Hynecek ............. H04N 25/133 257/292 |
| 2015/0264283 | A1* | 9/2015 | Kobayashi ........... H04N 25/771 257/229 |
| 2016/0064429 | A1* | 3/2016 | Iida .................... H01L 27/1461 348/311 |
| 2016/0071893 | A1 | 3/2016 | Shinohara |
| 2016/0099268 | A1 | 4/2016 | Minowa |
| 2018/0184027 | A1* | 6/2018 | Shinohara ............. H04N 25/70 |
| 2018/0277575 | A1 | 9/2018 | Ikeda et al. |
| 2019/0252432 | A1* | 8/2019 | Onuki ................ H01L 27/14656 |
| 2020/0252570 | A1 | 8/2020 | Sekine et al. |
| 2020/0275039 | A1 | 8/2020 | Shinohara |
| 2020/0304736 | A1* | 9/2020 | Shinohara ............. H04N 25/75 |
| 2020/0366858 | A1 | 11/2020 | Shinohara |
| 2022/0037380 | A1* | 2/2022 | Shinohara ........ H01L 27/14643 |

FOREIGN PATENT DOCUMENTS

| | | |
|---|---|---|
| JP | 2016-076832 A | 5/2016 |
| JP | 2018-157127 A | 10/2018 |

* cited by examiner

PHOTOELECTRIC CONVERSION APPARATUS, IMAGE SENSOR, SEMICONDUCTOR APPARATUS, PHOTOELECTRIC CONVERSION SYSTEM, AND EQUIPMENT

BACKGROUND OF THE INVENTION

Field of the Invention

The present invention relates to a photoelectric conversion apparatus, an image sensor, a semiconductor apparatus, a photoelectric conversion system, and an equipment.

Description of the Related Art

Japanese Patent Laid-Open No. 2011-249406 describes that by providing a p-type potential barrier region below an n-type charge storage region, flowing of some of photogenerated charges in the deep portion of a substrate into the charge storage region can be blocked.

In a photoelectric conversion apparatus including a photoelectric conversion portion of a first conductivity type that generates charges by incident light and accumulates the charges, and a charge storage region of the first conductivity type that storages the transferred accumulated charges from the photoelectric conversion portion, a charge signal generated in the substrate while the charges are stored in the charge storage region can be mixed into the charge storage region and serve as a pseudo signal. To prevent this, it is conceivable to provide a potential barrier region of a second conductivity type below the charge storage region. However, in this case, a region of the second conductivity type may be arranged below the potential barrier region of the second conductivity type via an intermediate semiconductor region. If the intermediate semiconductor region forms a neutral region, the potential barrier of the barrier region against signal charges generated in the neutral region can be lowered. Thus, some of the signal charges can be mixed into the charge storage region of the first conductivity type and serve as a pseudo signal.

SUMMARY OF THE INVENTION

Accordingly, the present invention is conceived as a response to the above-described disadvantages of the conventional art.

According to one aspect of the present invention, there is provided a photoelectric conversion apparatus comprising a photoelectric conversion apparatus comprising a semiconductor layer including a first surface and a second surface, a first semiconductor region of a first conductivity type arranged in the semiconductor layer and configured to accumulate a signal charge generated by incident light, a second semiconductor region of the first conductivity type arranged in the semiconductor layer, a first transfer electrode arranged on the first surface and configured to form, in the semiconductor layer, a channel for transferring the signal charge accumulated in the first semiconductor region to the second semiconductor region, a third semiconductor region of a second conductivity type arranged between the second semiconductor region and the second surface; and a fourth semiconductor region of the second conductivity type arranged between the third semiconductor region and the second surface, wherein the third semiconductor region at least partially overlaps the second semiconductor region in orthographic projection to the first surface, the third semiconductor region at least partially overlaps the fourth semiconductor region in orthographic projection to the first surface, and an effective value of an impurity concentration of an intermediate semiconductor region of the second conductivity type between the third semiconductor region and the fourth semiconductor region is not less than $2\times10^{13}$ cm$^{-3}$ and not more than $1\times10^{15}$ cm$^{-3}$, and a width of the intermediate semiconductor region in a normal direction with respect to the first surface is not less than 0.13 μm and not more than 0.8 μm.

Further features of the present invention will become apparent from the following description of exemplary embodiments with reference to the attached drawings.

DESCRIPTION OF THE EMBODIMENTS

Figure 1:
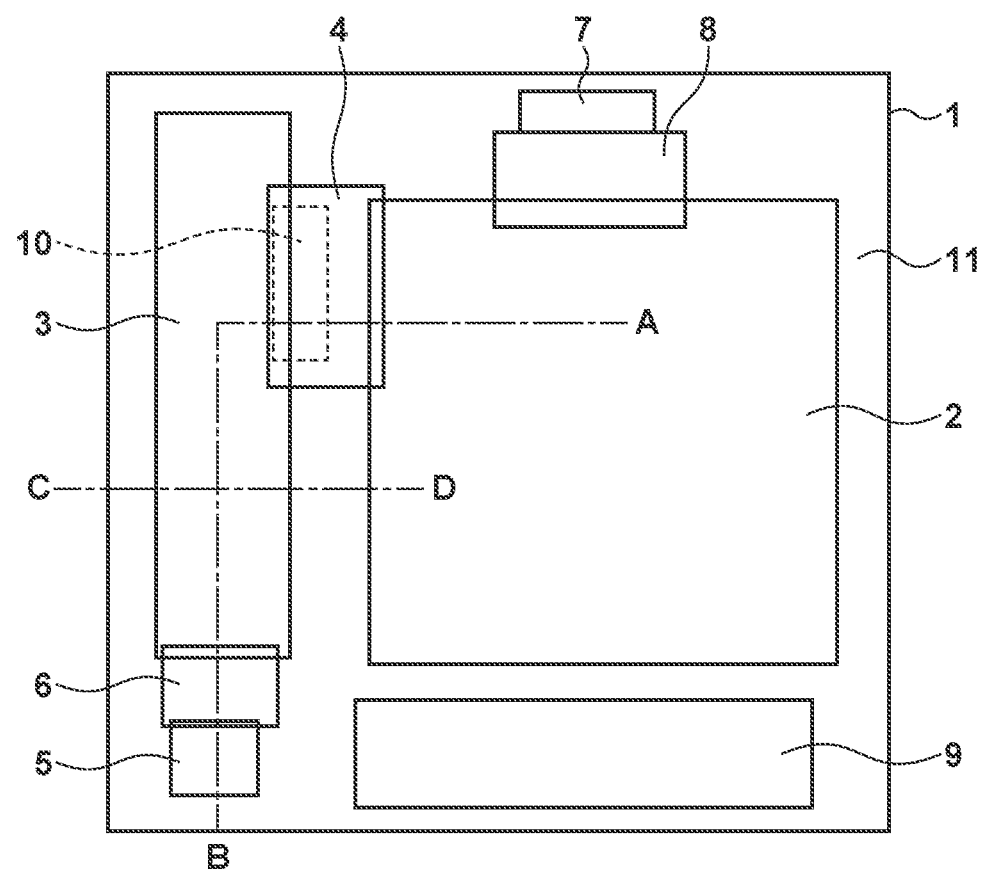
FIG. 1 is a plan view of a photoelectric conversion apparatus according to an embodiment.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

In embodiments hereinafter, assume that a signal carrier is an electron, the conductivity type of a signal storage layer is n-type, and a transistor forming a circuit is an n-type MOS transistor unless otherwise stated. However, the signal carrier may be assumed to be a hole, and the n-type conductivity may be switched to a p-type conductivity.

First Embodiment

A photoelectric conversion apparatus according to this embodiment will be described. The photoelectric conversion apparatus can include a Photo Diode (to be referred as "PD" hereinafter) portion, a memory portion, and a PD signal transfer portion for transferring signal charges accumulated in the PD portion to the memory portion. The photoelectric conversion apparatus can also include a memory signal transfer portion that transfers the signal charges from the memory portion to a floating diffusion region (to be referred to as an "FD portion" hereinafter) and an amplification MOS transistor that amplifies and outputs the signal charges.

FIG. 1 is a plan view obtained when a semiconductor substrate, which includes a semiconductor layer including a first surface and a second surface and in which a photoelectric conversion apparatus 1 has been formed, is seen in a planar view, and shows a simplified layout of the photoelectric conversion apparatus 1. The photoelectric conversion apparatus 1 can include a photodiode (PD) portion 2, a memory portion 3 for storing signal charges, a transfer electrode 4 for transferring the signal charges from the PD portion 2 to the memory portion 3, an FD portion 5, and a transfer electrode 6 for transferring the signal charges stored in the memory portion 3 to the FD portion 5. The photoelectric conversion apparatus 1 can also include an overflow drain (to be referred to as an "OFD" hereinafter) 7 for discharging signal charges to reset the PD portion 2, and a transfer electrode 8 for transferring the signal charges accumulated in the PD portion 2 to the OFD 7. The photoelectric conversion apparatus 1 can also include a MOS transistor portion 9 that includes a MOS transistor and the like for amplifying and reading out the signal charges transferred to the FD portion 5.

An n-type semiconductor region 10 which is in contact with an n-type semiconductor region of the memory portion 3 and is formed near a semiconductor interface is arranged below the transfer electrode 4. The photoelectric conversion apparatus 1 can also include an element isolation portion 11 which is used for element isolation and is formed by, for example, a diffusion layer semiconductor or an oxide film such as shallow trench isolation (STI) or the like.

The transfer electrode 4, the transfer electrode 6, and the transfer electrode 8 can be arranged on the first surface of the semiconductor substrate in which the PD portion 2 and the memory portion 3 are formed. In a planar view, the n-type semiconductor region 10 is arranged so as to at least partially overlap the transfer electrode 4.

The MOS transistor portion 9 can include a plurality of MOS transistors such as a MOS transistor for signal amplification, a reset MOS transistor for resetting the FD portion, and the like. A light-shielding membrane can be arranged on the memory portion 3 to reduce light into the memory portion 3 or to prevent light from entering the memory portion. For example, tungsten or the like can be used as the light-shielding membrane.

Figure 2:
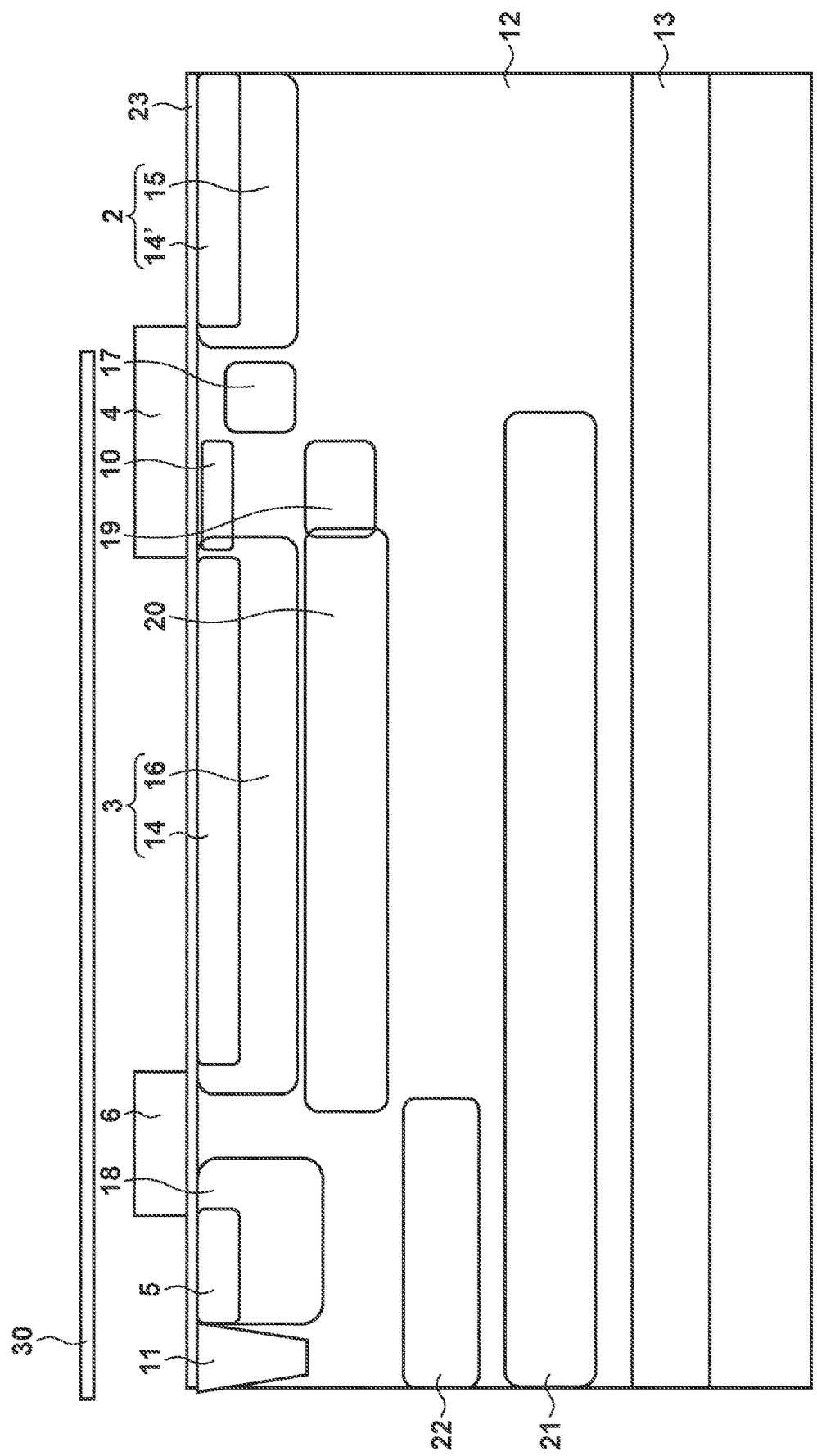
FIG. 2 is a sectional view of the photoelectric conversion apparatus according to the embodiment.

FIG. 2 is a sectional view taken along a line A to B indicated by an alternate long and short dashed line in FIG. 1. An n-type semiconductor substrate 12 with a low impurity concentration includes a semiconductor layer that includes the first surface, on which the transfer electrodes 4 and 6 forming a channel are formed, and the second surface on the opposite side of the first surface. An n-type semiconductor region 15 can accumulate signal charges generated from incident light. A p-type semiconductor region 13 overlaps the n-type semiconductor region 15 in a planar view as orthographic projection to the first surface. P-type semiconductor regions 14 and 14' with a high impurity concentration are formed on the semiconductor interfaces of the memory portion 3 and the PD portion 2, respectively. The PD portion 2 includes the p-type semiconductor region 14', the n-type semiconductor region 15, and an n-type semiconductor region which is immediately below the n-type semiconductor region 15 and extends to the depth of the p-type semiconductor region 13. The p-type semiconductor region 13 can determine the sensitivity of the PD portion 2.

An n-type semiconductor region 16 can store the signal charges transferred from the n-type semiconductor region 15. The memory portion 3 can include the p-type semiconductor region 14 and the n-type semiconductor region 16. The PD portion 2 and the memory portion 3 both are buried structure.

A p-type semiconductor region 17 can electrically isolate the n-type semiconductor region 15 and the n-type semiconductor region 10. The p-type semiconductor region 17 is positioned below the transfer electrode 4 and at least partially overlaps the transfer electrode 4 in a planar view. A p-type semiconductor region 18 can electrically isolate the n-type semiconductor region 16 and the FD portion 5 which serves as an n-type semiconductor region. A p-type semiconductor region 19 is below the n-type semiconductor region 10, at least partially overlaps the n-type semiconductor region 10 in a planar view, and is arranged such that it hardly overlaps the n-type semiconductor region 16.

A p-type semiconductor region 20 is arranged below the n-type semiconductor region 16 so as to at least partially overlap the n-type semiconductor region 16 in a planar view. The p-type semiconductor region 19 and the p-type semiconductor region 20 can prevent the signal charges generated in the PD portion due to incident light entering the PD portion 2 from diffusing and flowing into the n-type semiconductor region 10 and the n-type semiconductor region 16. Both p-type semiconductor regions 21 and 22 are regions for isolating the PD portions of adjacent photoelectric conversion apparatuses. The p-type semiconductor region 20 and the p-type semiconductor region 22 partially overlap each other. That is, in a planar view, the semiconductor region 21 and 22, which are the isolation boundary portion of the photoelectric conversion apparatus, may at least partially overlap the memory portion 3 and the FD portion 5.

A thin dielectric film 23 is formed on the semiconductor interface. The transfer electrodes 4, 6, and 8 and a gate electrode of a MOS transistor are formed on the thin dielectric film 23. A light-shielding membrane 30 can be arranged on the memory portion 3 (in a direction toward the transfer electrodes 4 and 6 with respect to the thin dielectric film 23 in FIG. 2) to reduce the light into the memory portion 3 or to prevent the light from entering the memory portion 3. The light-shielding membrane 30 can be arranged to cover regions other than the PD portion 2.

The p-type semiconductor region 19 can be formed as a semiconductor region different from the p-type semiconductor region 20. However, the p-type semiconductor region 20 may be formed so as to include the region of the p-type semiconductor region 19. In a planar view, the p-type semiconductor region 22 is arranged in a portion on the boundary between pixels other than the portion of the memory portion 3. The p-type semiconductor region 13 arranged in the deepest position can be electrically connected to the p-type semiconductor region 14 or the like on the semiconductor interface via the p-type semiconductor regions 20, 21, 22, 18, and the like, and have a fixed potential.

Figure 3:
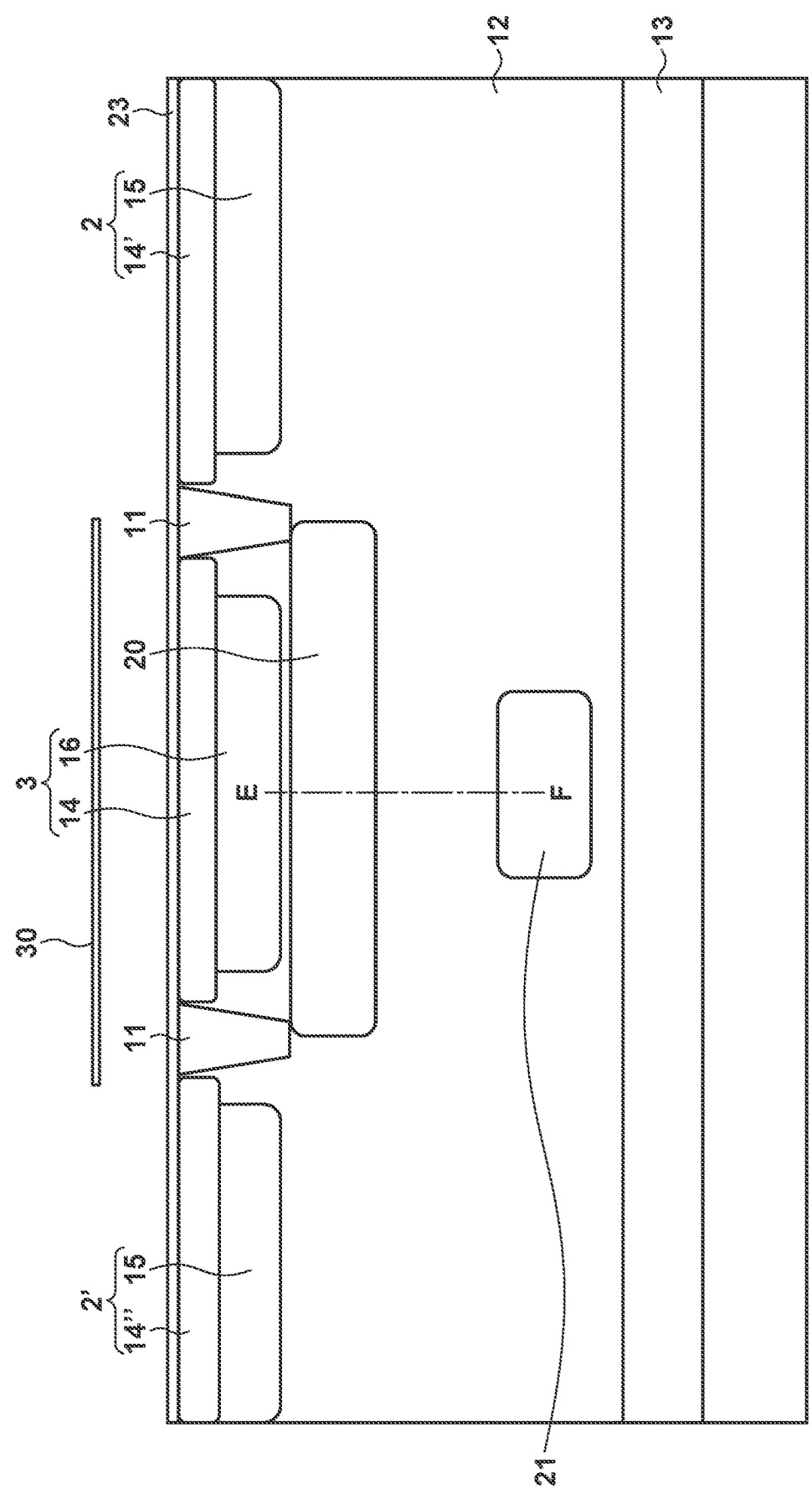
FIG. 3 is another sectional view of the photoelectric conversion apparatus according to the embodiment.

FIG. 3 is a sectional view taken along a line C to D indicated by an alternate long and short dashed line in FIG. 1. In FIG. 3, a PD portion 2' included in an adjacent pixel, which is not shown in FIG. 1, is described. The memory portion 3 is arranged between the PD portion 2 and the PD portion 2'. The PD portion 2 and the PD portion 2' of adjacent pixels are arranged so as to sandwich the memory portion 3. The light-shielding membrane 30 can be arranged on the memory portion 3. There is an intermediate semiconductor region between the p-type semiconductor region 20 and the p-type semiconductor region 21.

Conditions for suppressing mixing of a pseudo signal into the memory portion 3 will be described. Assume that each of the p-type semiconductor region 20 and the p-type semiconductor region 21 is a region where the effective impurity concentration as the effective value is $1\times10^{15}$ cm$^{-3}$ or more. That is, if the region includes donors and acceptors, the difference concentration between the donor concentration and the acceptor concentration is $1\times10^{15}$ cm$^{-3}$ or more in the region. With this, the intermediate semiconductor region is determined. For example, it is conceivable that the intermediate semiconductor region between the p-type semiconductor region 20 and the p-type semiconductor region 21 can have one of following three states. The first state is a state in which the intermediate semiconductor region includes p-type impurities and n-type impurities, whose the effective impurity concentrations are lower than $1\times10^{15}$ cm$^{-3}$. The second state is a state in which the entire intermediate semiconductor region is a p-type semiconductor region formed by the spreads of the tails of the impurity distributions of the p-type semiconductor regions 20 and 21. The third state is a state in which a p-type semiconductor region having the effective impurity concentration of $1\times10^{15}$ cm$^{-3}$ or more exists from the p-type semiconductor region 20 to the p-type semiconductor region 21.

Figure 4:
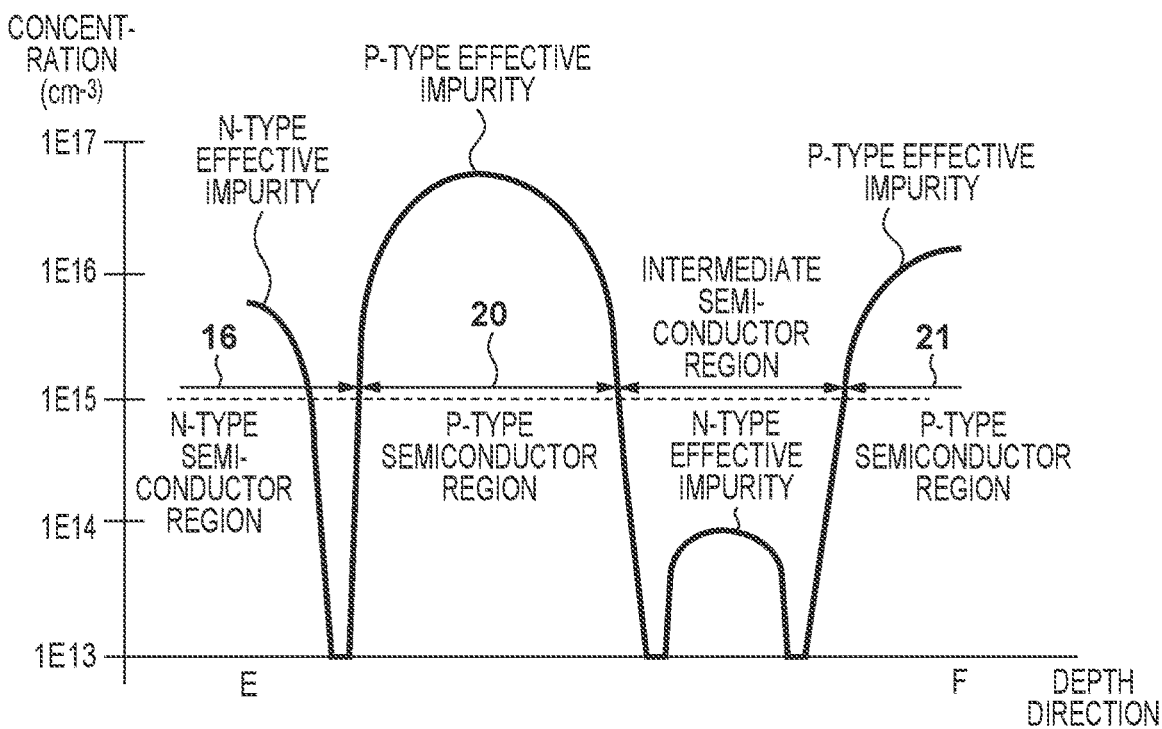
FIG. 4 is a graph showing the profile of an impurity concentration.

The conditions for suppressing mixing of a pseudo signal into the memory portion 3 will be described with reference to FIG. 4 showing the effective impurity concentration in a section taken along a line from E to F in the normal direction with respect to the first surface of the semiconductor substrate 12. As shown in FIG. 4, both p-type impurities and n-type impurities exist in the intermediate semiconductor region between the semiconductor region 20 and the semiconductor region 21. The impurity concentration in each of the p-type semiconductor region 20 and the p-type semiconductor region 21 is the average effective impurity concentration therein.

In order to prevent mixing of pseudo signal charges into the n-type semiconductor region 16, the depth of the p-type semiconductor region 20 can be shallow, and the impurity concentration thereof can be high so as to form a large potential barrier. However, if the depth of the p-type semiconductor region 20 is shallow and the impurity concentration thereof is high, because of the spread of the impurity profile thereof, the signal charge amount that the memory portion 3 can accept decreases unless the n-type semiconductor region 16 also has the high impurity concentration. However, if the n-type semiconductor region 16 also has the high impurity concentration, a signal pool of the n-type semiconductor region 16 can be formed in the lower portion of the transfer electrode 4. Accordingly, it becomes difficult to transfer almost all the signal charges stored in the n-type semiconductor region 16 during the transfer of the signal charges to the FD portion 5 by the transfer electrode 6. Therefore, the impurity concentration of the p-type semiconductor region 20 cannot be made too high.

On the other hand, the p-type semiconductor region 20 should not be depleted while signal charges are stored in the n-type semiconductor region 16 since the p-type semiconductor region 20 must function as a potential barrier. A reverse bias voltage which is normally about between 1.5 and 2 V is applied between the p-type semiconductor region 20 and the n-type semiconductor region 16. Therefore, if the distance between the two regions is 0.2 µm, the p-type semiconductor region is required to have the impurity concentration of about $2\times10^{16}$ cm$^{-3}$ or more. In consideration of the above-described problems, the impurity concentration of the p-type semiconductor region 20 is normally set to about $2\times10^{16}$ cm$^{-3}$. The peak of the impurity concentration of the semiconductor region 20 in this case is normally about $5\times10^{16}$ cm$^{-3}$.

Here, according to the theory of statistical mechanics, if there is a potential energy difference kT in a thermal equilibrium state, the density of free particles generally is e times different. k is the Boltzmann constant, T is the absolute temperature, and e is the Napier's constant. Accordingly, the potential difference in the semiconductor regions between which the hole concentration is e times different is kT/q. Here, q is an elementary charge. kT is about the thermal kinetic energy of the hole.

In order to serve as the potential barrier against a pseudo signal, the p-type semiconductor region 20 can have potentials of about four times of kT/q or more. In the p-type neutral semiconductor region, the potential difference of the two regions which have impurity concentration Na and Nb is expressed as (kt/q)ln(Nb/Na). In order for this difference to be 4 or more, Nb/Na is required to be about 50 or more.

Therefore, when the hole concentration at the peak of the impurity concentration of the p-type semiconductor region 20 is about $5\times10^{16}$ cm$^{-3}$, if a region where the hole concentration decreases to $1\times10^{15}$ cm$^{-3}$ or lower exists between the p-type semiconductor region 20 and the p-type semiconductor region 21, the impurity concentration difference becomes about 50 times. Accordingly, by giving an impurity concentration difference as described above, the p-type semiconductor region 20 can serve as a sufficient potential barrier against signal charges.

On the other hand, according to the above description, if the impurity concentration of the intermediate semiconductor region does not satisfy the predetermined conditions, the p-type semiconductor region 20 may not serve as an effective potential barrier against a pseudo signal. If the effective acceptor concentration of the intermediate semiconductor region is $1\times10^{15}$ cm$^{-3}$ or less, the p-type semiconductor region 20 satisfies the necessary condition to serve as a sufficient potential barrier. Here, the "necessary condition" is stated because the effective impurity concentration, which is the effective acceptor concentration here, can be different from the hole concentration.

In general, when the effective impurity concentration changes depending on the position, a change in carrier concentration thereof becomes more moderate than a change in effective impurity concentration. That is, when the effective acceptor concentration changes abruptly, the hole concentration does not sufficiently follow the abrupt change. This is because the thermal motion of holes smooth the changes between places separated by a distance shorter than the Debye length. Accordingly, in order to reflect the change in impurity concentration on the change in carrier concentration, the distance can be equal to or larger than the Debye length. The Debye length is determined by the carrier concentration. The lower the carrier concentration, the larger the Debye length.

When the hole concentration is $1\times10^{15}$ cm$^{-3}$, the Debye length is about 0.13 µm. In this case, the peak of the effective acceptor concentration of the p-type semiconductor region 20 is about $5\times10^{16}$ cm$^{-3}$, and the effective acceptor concentration decreases as the depth gradually increases. The effective acceptor concentration is $1\times10^{15}$ cm$^{-3}$ in the boundary of the intermediate semiconductor region, but the hole concentration can become $1\times10^{15}$ cm$^{-3}$ in a place deeper than the boundary. In order for the intermediate semiconductor region to include the place where the hole concentration becomes $1\times10^{15}$ cm$^{-3}$, the width of the intermediate semiconductor region can be equal to or larger than the Debye length, that is, about 0.13 μm or more.

Consider a case in which the width of the intermediate semiconductor region is large, the n-type semiconductor region occupies most of the intermediate semiconductor region, and the intermediate semiconductor region is in contact with the PD portion. In this case, the potential of the intermediate semiconductor region may become significantly lower than that of the p-type semiconductor region 20, and this can cause another problem. That is, if the potential of the intermediate semiconductor region is low, the amount of signal charges that can be accumulated in the n-type semiconductor region 15 decreases, and the saturation signal amount in the PD portion 2 decreases. Moreover, the saturated signal charge of the pixel flows out to the adjacent pixel through the intermediate semiconductor region, and blooming is likely to occur.

As compared with a normal photoelectric conversion apparatus without an OFD, a photoelectric conversion apparatus including an OFD can suppress blooming, but it becomes difficult to suppress blooming if the potential of the intermediate semiconductor region is low. Therefore, the intermediate semiconductor region is required to have the potential equal to or higher than a certain value. In practice, when considering the relation with the p-type semiconductor region 20, the potential difference between the intermediate semiconductor region and the p-type semiconductor region 20 needs to be suppressed within about eight times of kT/q.

Based on the discussion so far, since the eight power of e is about 2,980, if the hole concentration near the peak of the p-type semiconductor region 20 is about $5\times10^{16}$ cm$^{-3}$, the hole concentration of the intermediate semiconductor region needs to be about $2\times10^{13}$ cm$^{-3}$ or more. The Debye length is 0.8 μm when the carrier concentration is $2\times10^{13}$ cm$^{-3}$. If the width of the intermediate semiconductor region in the depth direction is 0.8 μm or less and the average effective acceptor concentration thereof is $2\times10^{13}$ cm$^{-3}$ or more, the potential difference between the intermediate semiconductor region and the p-type semiconductor region 20 is within about eight times of kT/q.

In summary, if an intermediate semiconductor region, in which the effective acceptor concentration becomes equal to or lower than $1\times10^{15}$ cm$^{-3}$, exists between the p-type semiconductor region 20 and the p-type semiconductor region 21, the width of the intermediate semiconductor region in the depth direction is 0.13 μm or more and 0.8 μm or less, and the average effective acceptor concentration of the intermediate semiconductor region therebetween is $2\times10^{13}$ cm$^{-3}$ or more, the potential difference between the intermediate semiconductor region and the p-type semiconductor region 20 becomes about four times or more and about eight times or less of kT/q. About four times or more and about eight times or less of kT/q means about 100 mV or more and about 200 mV or less at room temperature in terms of the potential.

When the conditions as described above are satisfied, the intermediate semiconductor region according to this embodiment can form a potential barrier against signal charges. Therefore, according to this embodiment, it may be possible to implement excellent characteristics that suppress mixing of pseudo signal charges into the memory portion and maintain the saturation signal amount at the conventional level.

Note that if the above-described conditions can be satisfied, the semiconductor substrate 12 may be a p-type semiconductor substrate in which the acceptor concentration is lower than $1\times10^{15}$ cm$^{-3}$. Alternatively, a p-type well may be arranged in the semiconductor substrate 12, in which the depth of the p-type well formed in the n-type semiconductor substrate 12 reaches about the p-type semiconductor region 13 shown in FIG. 2, and the effective acceptor concentration of a portion corresponding to the intermediate semiconductor region is lower than $1\times10^{15}$ cm$^{-3}$.

[Modification of First Embodiment]

Figure 5:
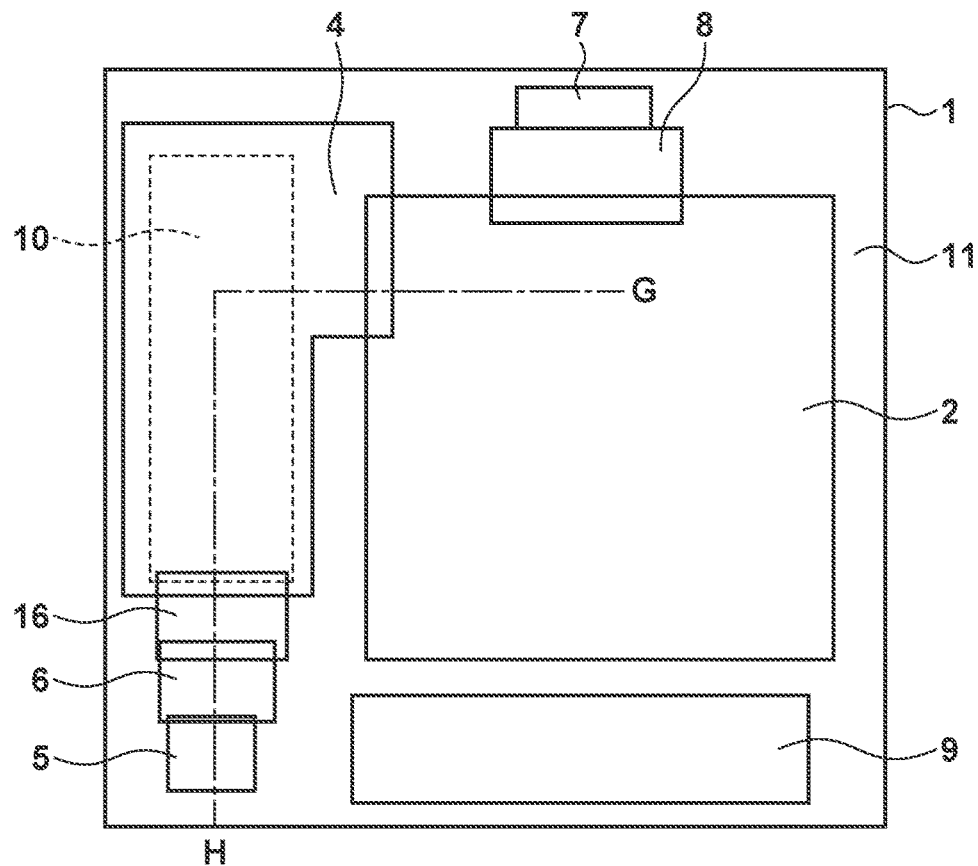
FIG. 5 is a plan view of a modification of the photoelectric conversion apparatus.
Figure 6:
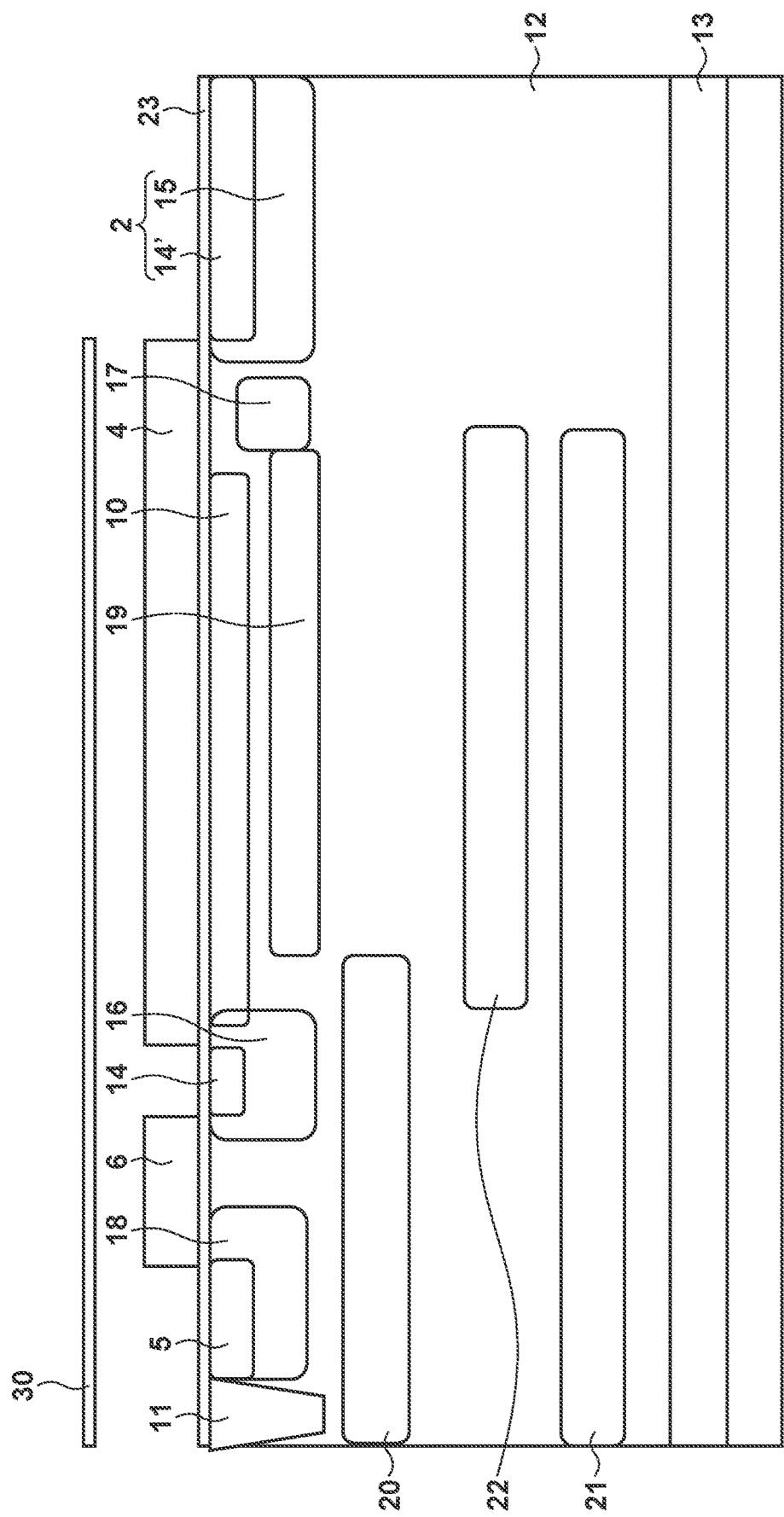
FIG. 6 is a sectional view of the modification of the photoelectric conversion apparatus.

FIG. 5 is a plan view of a modification of the first embodiment, and FIG. 6 shows a section taken along a line G to H indicated by an alternate long and short dashed line in FIG. 5. As can be seen from FIG. 6, the area of the transfer electrode 4 and the area of the n-type semiconductor region 10 formed immediately below the transfer electrode 4 are greater than in the first embodiment. Further, the transfer electrode 4 and the transfer electrode 6 are close to each other, the interface p-type semiconductor region 14 is formed therebetween, and the area of the n-type semiconductor region 16 is smaller than in the first embodiment. Accordingly, the n-type semiconductor region 10 itself can serve as a memory portion and takes initiative for storing signal charges. The n-type semiconductor region 16 also stores some of signal charges, but mainly plays a role as a signal charge passage from the n-type semiconductor region 10 to the transfer electrode 6.

In the structure as described above, the p-type semiconductor region 19 plays a role as a potential barrier for preventing signal charges from mixing into the n-type semiconductor region 10. Immediately below the p-type semiconductor region 19, the p-type semiconductor region 20 does not overlap the p-type semiconductor region 19 except for a small part in a planar view. That is, the p-type semiconductor region 19 and the p-type semiconductor region 20 partially overlap each other. Further, the p-type semiconductor region 20 and the p-type semiconductor region 22 also partially overlap each other. As has been described in the first embodiment, the intermediate semiconductor region between the p-type semiconductor region 19 and the p-type semiconductor region 22 is formed to have an effective acceptor concentration of $1\times10^{15}$ cm$^{-3}$ or less. The width of the intermediate semiconductor region in the depth direction is 0.13 μm or more and 0.8 μm or less, and the average effective acceptor concentration of the intermediate semiconductor region is $2\times10^{13}$ cm$^{-3}$ or more. In this case, the potential difference between the intermediate semiconductor region and the p-type semiconductor region 19 becomes about four times or more and about eight times or less of kT/q, and the p-type semiconductor region 19 functions as an appropriate potential barrier.

On the other hand, the p-type semiconductor region 20 and the p-type semiconductor region 21 at least partially overlap each other. A second intermediate semiconductor region having conditions similar to those in the first embodiment is arranged between the p-type semiconductor region 20 and the p-type semiconductor region 21. Accordingly, the p-type semiconductor region 20 can function as an effective potential barrier that suppresses mixing of charges into the n-type semiconductor region 16. Further, the p-type semiconductor region 19 is arranged in a position shallower than the p-type semiconductor region 20. This is because the n-type semiconductor region 10 that stores signal charges is arranged in a position shallower than the n-type semiconductor region 16. In order to prevent a pseudo signal from mixing into the n-type semiconductor region 10, the shallower the position where the p-type semiconductor region 19 serving as a potential barrier is formed, the higher the barrier effect against the charges generated while a signal is stored.

The effect of suppressing mixing of a pseudo signal into the memory portion can be further higher in this embodiment than in the first embodiment. Note that since the p-type semiconductor region 14 in the semiconductor interface and the p-type semiconductor region 13 formed in the deepest portion need to be electrically connected to each other, the p-type semiconductor region 20 and the p-type semiconductor region 13 include portions electrically connected to each other.

Note that in this modification, the effective acceptor concentration of the second intermediate semiconductor region is $1 \times 10^{15}$ cm$^{-3}$ or less, and the average effective acceptor concentration thereof is $2 \times 10^{13}$ cm$^{-3}$ or more. Further, the width of the second intermediate semiconductor region in the depth direction is 0.13 μm or more and 0.8 μm or less. If the conditions described above are satisfied, the semiconductor substrate 12 may be a p-type semiconductor substrate in which the acceptor concentration is lower than $1 \times 10^{15}$ cm$^{-3}$. Alternatively, a p-type well may be used which is formed in the n-type semiconductor substrate 12, has the depth reaching about the p-type semiconductor region 13, and in which the effective acceptor concentration of a portion corresponding to the second intermediate semiconductor region is lower than $1 \times 10^{15}$ cm$^{-3}$. Further, a structure may be used in which the formation range of the p-type semiconductor region 22 extends immediately below the p-type semiconductor region 20 in FIG. 6.

In this case, if a third intermediate semiconductor region, which satisfies conditions similar to those for the intermediate semiconductor region between the p-type semiconductor region 20 and the p-type semiconductor region 21, exists between the p-type semiconductor region 20 and the p-type semiconductor region 22, the effect of suppressing mixing of a pseudo signal can be maintained. However, even if the conditions are not satisfied, since the area of the n-type semiconductor region 16 is small, as long as the p-type semiconductor region 19 serves as an effective potential barrier, the degree of impairing the effect of suppressing mixing of a pseudo signal is small as a whole.

As has been described above, according to this modification, it is possible to increase the effect of suppressing mixing of a pseudo signal into the memory portion without decreasing the saturation signal amount in the PD portion.

Second Embodiment

Figure 7:
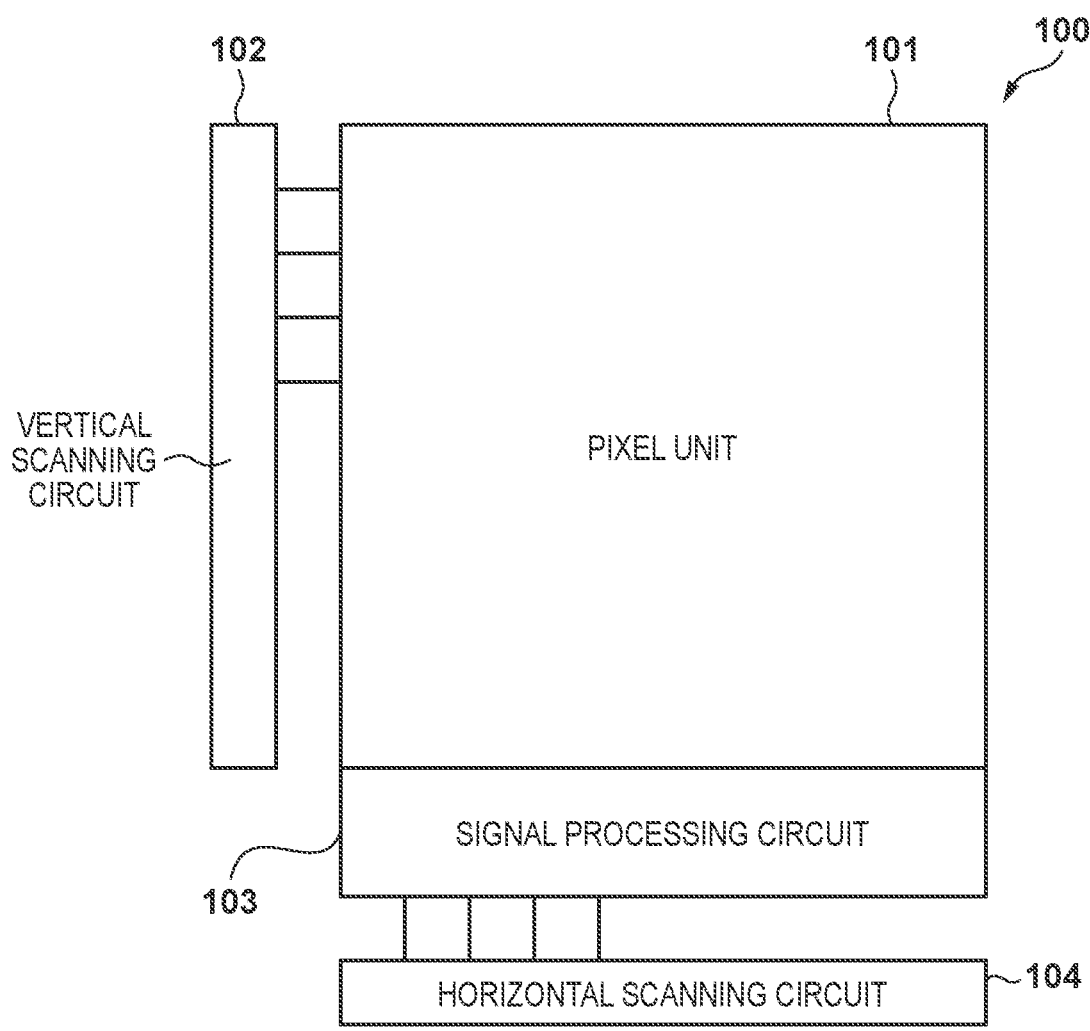
FIG. 7 is a plan view showing an outline of an image sensor.

An example in which the above-described photoelectric conversion apparatus is applied to an image sensor 100 will be described with reference to FIG. 7. The image sensor 100 includes, for example, a pixel unit 101 in which a plurality of pixels are arranged in a matrix, a vertical scanning circuit 102 that controls each row of pixels in the pixel unit 101, a signal processing circuit 103 that reads out and processes the signals, and a horizontal scanning circuit 104 that controls a circuit provided for each column. Each pixel includes the photoelectric conversion apparatus described in the first embodiment and the modification. The image sensor 100 can also include a control circuit that generates a control signal and a timing signal for controlling the image sensor.

Typically, the vertical scanning circuit 102 will execute control to select a predetermined row of pixels and read out signals from the pixels of this selected row. Under the control of the vertical scanning circuit 102, a signal from a PD portion 2 of each photoelectric conversion apparatus will be output to a corresponding vertical signal line (not shown). The horizontal scanning circuit 104 will execute control to control the signal processing circuit 103 to output, to the outside, the signals read out on a row basis. The signal processing circuit 103 can include an amplification circuit for amplifying the signal from each pixel, a circuit for reducing noise, and an A/D converter.

Next, a sensor including a global shutter will be described. The sensor including the global shutter includes a plurality of PD portions and corresponding memory portions. A global shutter function is implemented when signal charges are collectively transferred from the plurality of PD portions to the corresponding memory portions.

A global shutter operation is performed as follows. Under the control of the vertical scanning circuit 102, the PD portion 2 of each pixel included in the pixel unit 101 starts, at a predetermined timing, accumulating signal charges corresponding to incident light. Next, under the control of the vertical scanning circuit 102, the potentials of transfer electrodes 4 of the respective photoelectric conversion apparatuses are collectively set to VH, and the signal charges accumulated in a plurality of the PD portions 2 are transferred at the same timing to the corresponding semiconductor regions used for storing the signal charges. The signal charges accumulated in the PD portions 2 can be read out at the same timing from the PD portions 2 in this manner. Next, the vertical scanning circuit 102 controls transfer electrodes 6 of each row to transfer the signal charges to respective FD portions 5. The signal from each FD portion 5 is amplified by the amplification circuit of a corresponding MOS transistor portion 9, and the amplified signal is output to the corresponding vertical signal line to be input to the signal processing circuit 103. The signal processing circuit 103 will, for example, amplify the signal, perform A/D conversion on the signal, and subsequently output, under the control of the horizontal scanning circuit 104, the signal to the outside. The image sensor according to this embodiment is applicable to the imaging unit of a system or equipment described below.

Third Embodiment

Figure 8:
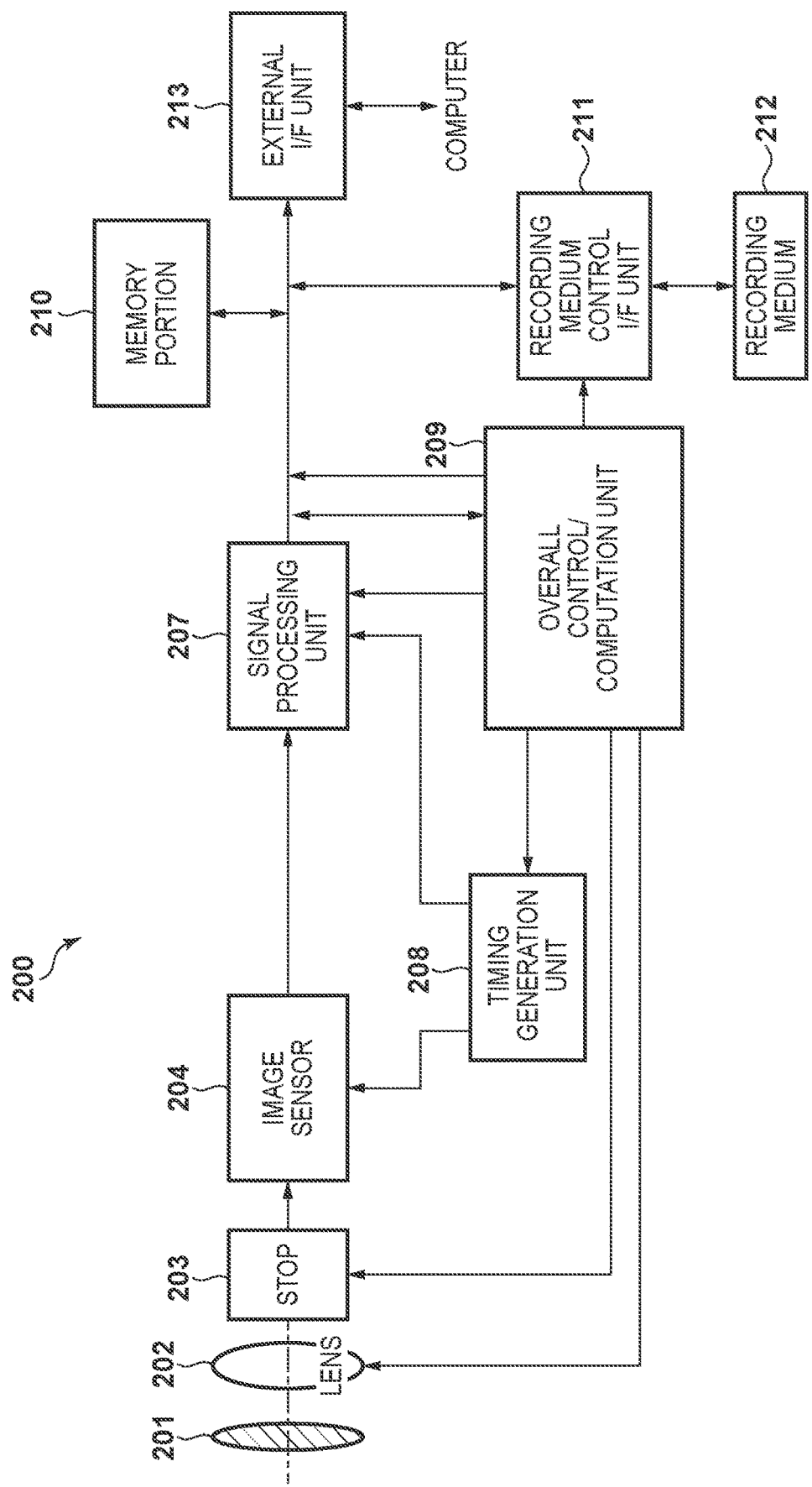
FIG. 8 is a view showing an example of a photoelectric conversion system.

A photoelectric conversion system according to this embodiment will be described with reference to FIG. 8. FIG. 8 is a block diagram showing the outline configuration of the photoelectric conversion system according to this embodiment. The photoelectric conversion apparatus described in the first embodiment and the modification is applicable to various photoelectric conversion systems. Examples of the photoelectric conversion systems are a digital still camera, a digital camcorder, a monitoring camera, a copying machine, a facsimile machine, a mobile phone, an onboard camera, an observation satellite, and the like. Further, a camera module including an optical system such as a lens and an image sensor is also included in the photoelectric conversion system. FIG. 8 exemplarily shows a block diagram of a digital still camera 200 as one example out of the above-described examples.

The digital still camera 200 exemplified in FIG. 8 includes an image sensor 204 in which the photoelectric conversion apparatus is arranged. A plurality of pixels are arranged in the image sensor 204, and each pixel includes the photoelectric conversion apparatus according to the first embodiment and the modification. The digital still camera 200 further includes a lens 200 which forms an optical image of an object on the image sensor 204, a stop 203 for variably changing the amount of light passing through the lens 202, and a barrier 201 for protecting the lens 202. The lens 202 and the stop 203 constitute an optical system which focuses light onto the image sensor 204. The image sensor 204 includes the photoelectric conversion apparatus according to the above-described embodiment, and converts the optical image formed by the lens 202 into electrical signals.

The photoelectric conversion system further includes a signal processing unit 207 which is an image generation unit that generates an image by processing output signals output from the image sensor 204. The signal processing unit 207 performs an operation of outputting image data after performing various types of correction and compression as needed. The signal processing unit 207 may be formed on a semiconductor substrate on which the image sensor 204 is mounted, or may be formed on a semiconductor substrate different from the semiconductor substrate mounted with the image sensor 204. The image sensor 204 and the signal processing unit 207 may be formed on the same semiconductor substrate.

The photoelectric conversion system further includes a memory portion 210 for temporarily storing image data, and an external interface unit (external I/F unit) 213 for communication with an external computer or the like. The photoelectric conversion system further includes a recording medium 212 such as a semiconductor memory for recording or reading out imaging data, and a recording medium control interface unit (recording medium control I/F unit) 211 for recording or reading out with respect to the recording medium 212. Note that the recording medium 212 may be built in the photoelectric conversion system, or may be attachable/detachable to/from the photoelectric conversion system.

The photoelectric conversion system further includes an overall control/computation unit 209 which controls various types of computation and the overall digital still camera, and a timing generation unit 208 which outputs various types of timing signals to the image sensor 204 and the signal processing unit 207. Here, the timing signal or the like may be input from the outside. The photoelectric conversion system is only required to include at least the image sensor 204 and the signal processing unit 207 which processes an output signal output from the image sensor 204.

The image sensor 204 outputs an imaging signal to the signal processing unit 207. The signal processing unit 207 performs predetermined signal processing on the imaging signal output from the image sensor 204, and outputs image data. The signal processing unit 207 generates an image using the imaging signal. Thus, according to this embodiment, a photoelectric conversion system applied with the photoelectric conversion apparatus according to the above described embodiment can be implemented.

Fourth Embodiment

Figure 9A:
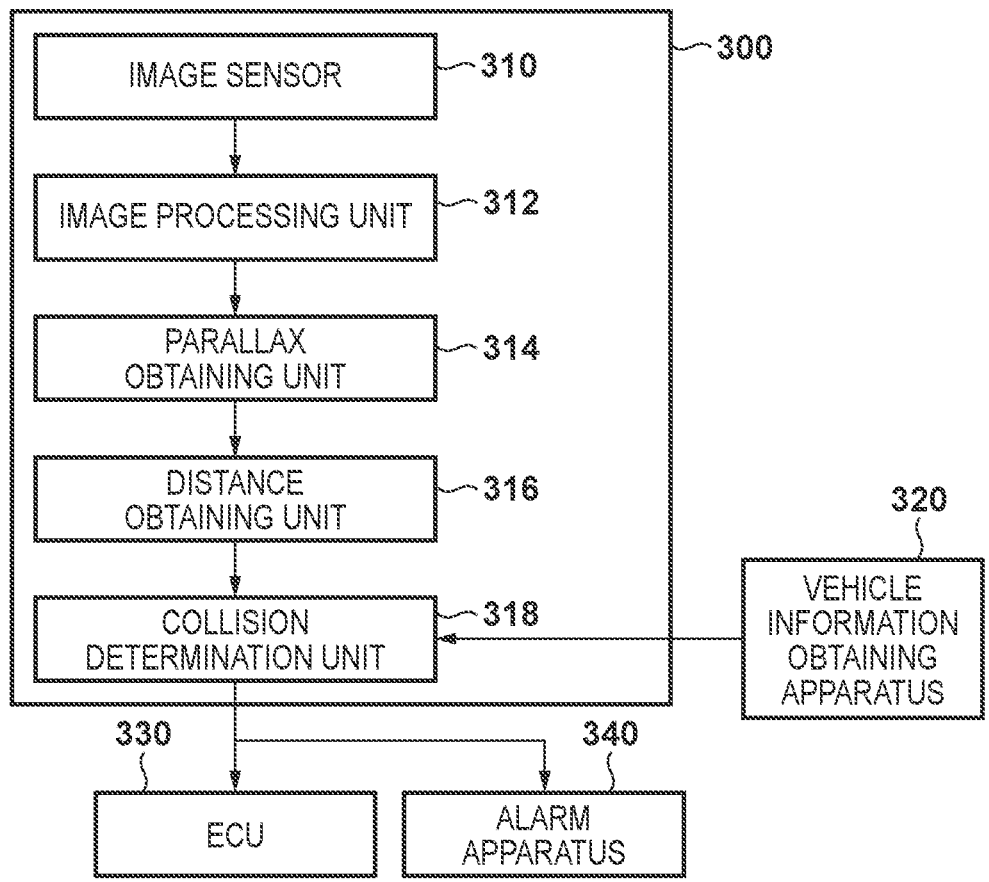
FIG. 9A is a view showing a photoelectric conversion system.
Figure 9B:
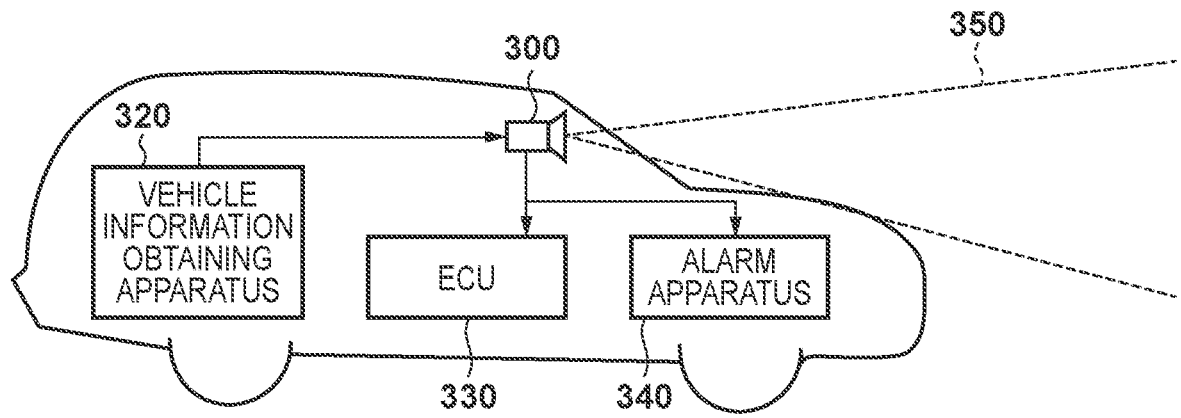
FIG. 9B is a view showing a mobile body to which the photoelectric conversion system is applied.

A photoelectric conversion system and a mobile body according to this embodiment will be described with reference to FIGS. 9A and 9B. FIGS. 9A and 9B are views showing the arrangements of the photoelectric conversion system and mobile body according to this embodiment, respectively. FIG. 9A shows an example of the photoelectric conversion system regarding an onboard camera. A photoelectric conversion system 300 includes an image sensor 310. Pixels each including the photoelectric conversion apparatus according to the above described embodiment are arranged in the image sensor 310. The photoelectric conversion system 300 includes an image processing unit 312 which performs image processing on a plurality of image data obtained by the image sensor 310, and a parallax obtaining unit 314 which calculates the parallax (the phase difference between parallax images) from the plurality of image data obtained by the photoelectric conversion system 300. The photoelectric conversion system 300 also includes a distance obtaining unit 316 which calculates the distance to a target object based on the calculated parallax, and a collision determination unit 318 which determines, based on the calculated distance, whether there is the possibility of a collision.

Here, the parallax obtaining unit 314 and the distance obtaining unit 316 are examples of distance information obtaining unit for obtaining the distance information of a target object. That is, distance information includes pieces of information concerning the parallax, the defocus amount, the distance to the target object, and the like. The collision determination unit 318 may use one of these pieces of distance information to determine the possibility of a collision. Each distance information obtaining unit may be implemented by specially designed hardware or a software module. Alternatively, each distance information obtaining unit may be implemented by an FPGA (Field Programmable Gate Array) or an ASIC (Application Specific Integrated Circuit), or may be implemented by a combination of them.

The photoelectric conversion system 300 is connected to a vehicle information obtaining apparatus 320, and can obtain vehicle information such as the vehicle speed, yaw rate, and steering angle. Further, the photoelectric conversion system 300 is connected to an ECU (Electronic Control Unit) 330 which is a control apparatus that outputs, based on the determination result of the collision determination unit 318, a control signal for causing the vehicle to generate a braking force. The photoelectric conversion system 300 is also connected to an alarm apparatus 340 that issues an alarm to the driver based on the determination result of the collision determination unit 318. For example, if the determination result of the collision determination unit 318 indicates that there is a high possibility of a collision, the ECU 330 controls the vehicle to avoid the collision and reduce the damage by applying the brake, returning the accelerator, suppressing the engine output, or the like. The alarm apparatus 340 warns the user by sounding an alarm such as a sound, displaying alarm information on the screen of a car navigation system or the like, or giving vibration to the seat belt or steering wheel.

In this embodiment, the photoelectric conversion system 300 captures the surroundings of the vehicle, for example, the front or rear of the vehicle. FIG. 9B shows the photoelectric conversion system in a case of capturing the front of the vehicle. Dotted lines 350 show an example of the capturing range. The vehicle information obtaining apparatus 320 sends an instruction to the photoelectric conversion system 300 or the image sensor 310. With such a configuration, the accuracy of distance measurement can be further improved.

An example of control for avoiding a collision with another vehicle has been described above. However, the present invention is also applicable to control for automated driving following another vehicle or control for automated driving without deviation from a lane. Further, the photoelectric conversion system is applicable not only to a vehicle such as a motor vehicle but also to, for example, a mobile body (mobile apparatus) such as a ship, an airplane, or an industrial robot. In addition, the photoelectric conversion system is applicable not only to a mobile body but also to an equipment that widely uses object recognition, such as ITS (Intelligent Transportation System).

Fifth Embodiment

Figure 10:
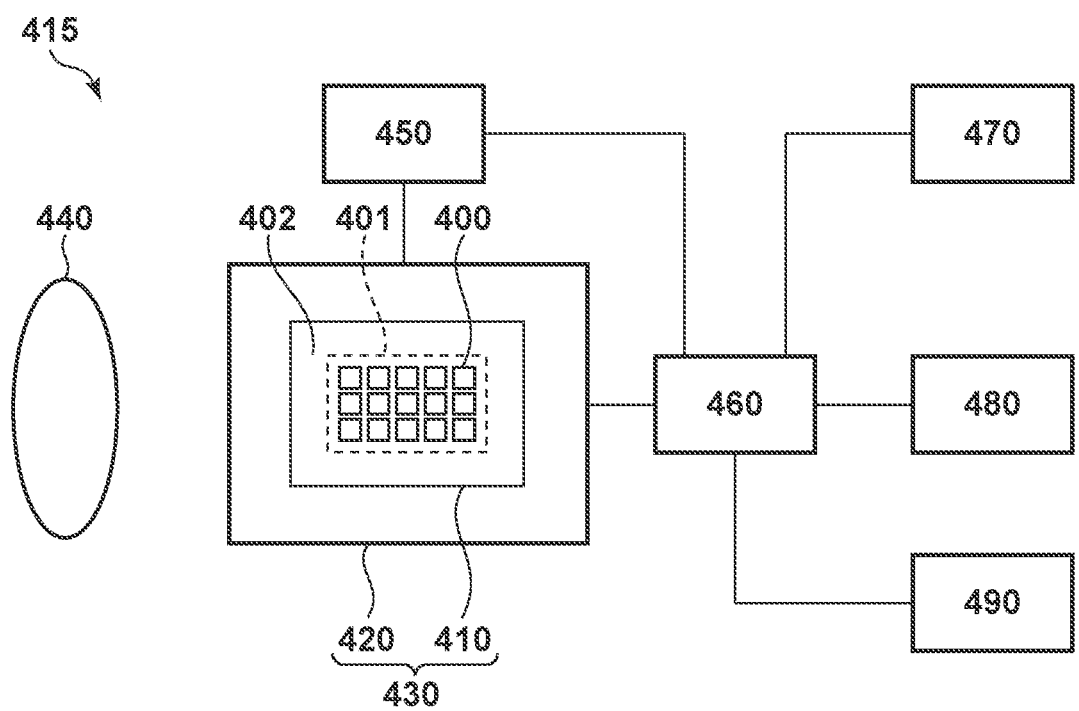
FIG. 10 is a view showing an example of application to an equipment.

An example of an equipment to which the photoelectric conversion apparatus according to the first embodiment and the modification is applied will be described. FIG. 10 is a schematic view for explaining an equipment 415 including a semiconductor apparatus 430 that includes the photoelectric conversion apparatus according to the described embodiment. The semiconductor apparatus 430 includes an imaging unit 401 in which pixels 400 each including the photoelectric conversion apparatus are formed in a semiconductor substrate 402. The semiconductor apparatus 430 can include, in addition to a semiconductor device 410 which includes a semiconductor layer, a package 420 for containing the semiconductor device 410. The package 420 can include a base to which the semiconductor device 410 is fixed and a lid made of glass or the like facing the semiconductor device 410. The package 420 can further include a connection member such as a bonding wire and bump for connecting a terminal arranged in the base and a terminal arranged in the semiconductor device 410.

The equipment 415 can include at least one of an optical apparatus 440, a control apparatus 450, a processing apparatus 460, a display apparatus 470, a storage apparatus 480, and a mechanical apparatus 490. The optical apparatus 440 may be provided so as to correspond to the semiconductor apparatus 430. The optical apparatus 440 is, for example, a lens, a shutter, and a mirror. The control apparatus 450 controls the semiconductor apparatus 430. The control apparatus 450 is, for example, a semiconductor apparatus such as an ASIC.

The processing apparatus 460 processes a signal output from the semiconductor apparatus 430. The processing apparatus 460 can be a semiconductor apparatus such as a CPU or ASIC for forming an AFE (Analog Front End) or a DFE (Digital Front End). The display apparatus 470 may be an EL display apparatus or liquid crystal display apparatus that displays information (image) obtained by the semiconductor apparatus 430. The storage apparatus 480 may be a magnetic device or semiconductor device that stores the information (image) obtained by the semiconductor apparatus 430. The storage apparatus 480 can be a volatile memory such as an SRAM or DRAM or a nonvolatile memory such as a flash memory or hard disk drive.

The mechanical apparatus 490 can include a moving unit or a propulsion unit such as a motor or engine. In the equipment 415, a signal output from the semiconductor apparatus 430 is displayed by the display apparatus 470 or transmitted to the outside by a communication apparatus (not shown) included in the equipment 415. Hence, the equipment 415 can further include, separately from a storage circuit and an arithmetic circuit included in the semiconductor apparatus 430, the storage apparatus 480 and the processing apparatus 460. The mechanical apparatus 490 may be controlled based on a signal output from the semiconductor apparatus 430.

In addition, the equipment 415 is suitable for an electronic equipment such as an information terminal (for example, a smartphone or a wearable terminal) which has an imaging function, a camera (for example, an interchangeable lens camera, a compact camera, a video camera, or a monitoring camera), or the like. The mechanical apparatus 490 in the camera can drive the components of the optical apparatus 440 in order to perform zooming, an in-focus operation, and a shutter operation. Alternatively, the mechanical apparatus 490 in the camera can move the semiconductor apparatus 430 in order to perform an anti-vibration operation.

Furthermore, the equipment 415 can be a transportation equipment such as a vehicle, a ship, an airplane, or the like. The mechanical apparatus 490 in a transportation equipment can be used as a moving apparatus. The equipment 415 as a transportation equipment may be used as an equipment for transporting the semiconductor apparatus 430 or an equipment that uses an imaging function to assist and/or automate driving (steering). The processing apparatus 460 for assisting and/or automating driving (steering) can perform, based on the information obtained by the semiconductor apparatus 430, processing to operate the mechanical apparatus 490 as a moving apparatus. Alternatively, the equipment 415 may be a medical equipment such as an endoscope or the like, a measurement equipment such as a range sensor or the like, an analysis equipment such as an electron microscope, an office equipment such as a copy machine or the like, or an industrial equipment such as a robot or the like.

According to the photoelectric conversion apparatus according to the described embodiment, it is possible to obtain good pixel characteristics. Hence, the value of the semiconductor apparatus can be increased. This aforementioned "increase in the value" corresponds to at least one of addition of a function, improvement of performance, improvement of characteristics, improvement of reliability, improvement of production yield, reduction of an environmental load, cost reduction, size reduction, and weight reduction.

Therefore, using the semiconductor apparatus 430 according to this embodiment in the equipment 415 will improve the value of the equipment. For example, by incorporating the semiconductor apparatus 430 in a transportation equipment, the transportation equipment will be able to have excellent performance when the outside imaging of the transportation equipment is to be performed or when the external environment is to be measured. Hence, in the producing and selling of transportation equipments, determining to incorporate the semiconductor apparatus according to this embodiment in a transportation equipment will be advantageous in increasing the performance of the transportation equipment itself. In particular, the semiconductor apparatus 430 is applicable to a transportation equipment that uses information obtained by a semiconductor apparatus to perform driving support and/or automated driving of the transportation equipment.

[Modifications of Embodiments]

The present invention is not limited to the above-descried embodiments, and various modifications can be made. For example, an example in which a part of the configuration of any of the embodiments is added to another embodiment and an example in which a part of the configuration of any of the embodiments is replaced with a part of the configuration of another embodiment are also included in embodiments of the present invention. The photoelectric conversion systems and the equipments described in the above-described third to fifth embodiments are examples of a photoelectric conversion apparatus to which the photoelectric conversion apparatus is applicable. The photoelectric conversion system to which the photoelectric conversion apparatus according to the present invention is applicable is not limited to the configurations described in FIGS. 8 to 10.

The disclosure content of the present specification includes not only matters described in the present specification but also all matters that can be understood from the present specification and the attached drawings. The disclosure content of the present specification also includes a complementary set of the concept described in the present specification. That is, for example, if there is a description that "A is larger than B" in the present specification, the present specification shall disclose that "A is not larger than B" even if a description that "A is not larger than B" is omitted. This is because, if the description "A is larger than B" is provided, it is premised that a case of "A is not larger than B" is considered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-158968, filed Sep. 23, 2020, which is hereby incorporated by reference herein in its entirety.

What is claimed is:

1. A photoelectric conversion apparatus comprising:
a semiconductor layer including a first surface and a second surface;
a first semiconductor region of a first conductivity type arranged in the semiconductor layer and configured to accumulate a signal charge generated by incident light;
a second semiconductor region of the first conductivity type arranged in the semiconductor layer;
a first transfer electrode arranged on the first surface and configured to form, in the semiconductor layer, a channel for transferring the signal charge accumulated in the first semiconductor region to the second semiconductor region;
a third semiconductor region of a second conductivity type arranged between the second semiconductor region and the second surface; and
a fourth semiconductor region of the second conductivity type arranged between the third semiconductor region and the second surface;
wherein the third semiconductor region at least partially overlaps the second semiconductor region in orthographic projection to the first surface,
the third semiconductor region at least partially overlaps the fourth semiconductor region in orthographic projection to the first surface, and
an effective value of an impurity concentration of an intermediate semiconductor region of the second conductivity type between the third semiconductor region and the fourth semiconductor region is not less than $2\times10^{13}$ cm$^{-3}$ and not more than $1\times10^{15}$ cm$^{-3}$, and a width of the intermediate semiconductor region in a normal direction with respect to the first surface is not less than 0.13 μm and not more than 0.8 μm.

2. The apparatus according to claim 1, wherein
a fifth semiconductor region of the second conductivity type is further arranged between the second semiconductor region and the fourth semiconductor region and in a position deeper than the third semiconductor region in the normal direction with respect to the first surface, and the fifth semiconductor region at least partially overlaps the second semiconductor region in orthographic projection to the first surface.

3. The apparatus according to claim 2, wherein
the fourth semiconductor region and the fifth semiconductor region partially overlap each other in orthographic projection to the first surface.

4. The apparatus according to claim 2, wherein
the third semiconductor region and the fifth semiconductor region partially overlap each other in orthographic projection to the first surface.

5. The apparatus according to claim 2, wherein
a sixth semiconductor region of the second conductivity type is further arranged between the fourth semiconductor region and the second surface, and an effective value of an impurity concentration of a second intermediate semiconductor region between the fifth semiconductor region and the sixth semiconductor region is not less than $2\times10^{13}$ cm$^{-3}$ and not more than $1\times10^{15}$ cm$^{-3}$, and a width of the second intermediate semiconductor region in a normal direction with respect to the first surface is not less than 0.13 μm and not more than 0.8 μm.

6. The apparatus according to claim 2, wherein
an effective value of an impurity concentration of a third intermediate semiconductor region of the second conductivity type between the fourth semiconductor region and the fifth semiconductor region is not less than $2\times10^{13}$ cm$^{-3}$ and not more than $1\times10^{15}$ cm$^{-3}$, and a width of the third intermediate semiconductor region in a normal direction with respect to the first surface is not less than 0.13 μm and not more than 0.8 μm.

7. The apparatus according to claim 1, further comprising:
a floating diffusion region of the first conductivity type arranged between the first surface and the second surface; and
a second transfer electrode arranged on the first surface and configured to form, in the semiconductor layer, a channel for transferring the signal charge from the second semiconductor region to the floating diffusion region,
wherein a part of the second semiconductor region is arranged so as to overlap a part of the second transfer electrode in orthographic projection to the first surface.

8. The apparatus according to claim 7, further comprising a transistor configured to amplify a signal from the floating diffusion region.

9. An image sensor comprising:
a pixel unit in which a pixel including a photoelectric conversion apparatus defined in claim 1 is arranged;
a vertical scanning circuit configured to control the pixel unit to read out a signal from the pixel; and
a processing circuit configured to process the signal read out from the pixel.

10. A semiconductor apparatus comprising:
a semiconductor device including a pixel unit in which a pixel including a photoelectric conversion apparatus defined in claim 1 is arranged; and
a package configured to store the semiconductor device.

11. A photoelectric conversion system comprising:
an optical system including a lens;
a pixel unit in which a pixel including a photoelectric conversion apparatus defined in claim 1 is arranged, the photoelectric conversion apparatus being configured to convert light having passed through the optical system into an electrical signal; and
a signal processing unit configured to process a signal output from the pixel unit.

12. An equipment that includes a photoelectric conversion apparatus defined in claim 1,
wherein the equipment further comprises at least one of an optical apparatus corresponding to the photoelectric conversion apparatus;
a control apparatus configured to control the photoelectric conversion apparatus;
a processing apparatus configured to process a signal output from the photoelectric conversion apparatus;
a display apparatus configured to display information obtained by the photoelectric conversion apparatus;
a storage apparatus configured to store the information obtained by the photoelectric conversion apparatus; and a mechanical apparatus configured to operate based on the information obtained by the photoelectric conversion apparatus.

* * * * *